(12) United States Patent
Kim et al.

(10) Patent No.: US 11,982,719 B2
(45) Date of Patent: May 14, 2024

(54) APPARATUS AND METHOD FOR DETERMINING DEGRADATION STATE OF BATTERY, BATTERY PACK AND ELECTRIC VEHICLE

(71) Applicant: LG CHEM, LTD., Seoul (KR)

(72) Inventors: Young-Deok Kim, Daejeon (KR); Dae-Soo Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 606 days.

(21) Appl. No.: 17/269,697

(22) PCT Filed: Apr. 13, 2020

(86) PCT No.: PCT/KR2020/004981
§ 371 (c)(1),
(2) Date: Feb. 19, 2021

(87) PCT Pub. No.: WO2020/213905
PCT Pub. Date: Oct. 22, 2020

(65) Prior Publication Data
US 2022/0413058 A1 Dec. 29, 2022

(30) Foreign Application Priority Data
Apr. 17, 2019 (KR) .................. 10-2019-0044969

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/3842* (2019.01); *G01R 31/396* (2019.01); *H01M 10/48* (2013.01)

(58) Field of Classification Search
None
See application file for complete search history.

(56) References Cited

U.S. PATENT DOCUMENTS

| | | |
|---|---|---|
| 2009/0123813 A1 | 5/2009 | Chiang et al. |
| 2011/0012604 A1 | 1/2011 | Tsujiko et al. |

(Continued)

FOREIGN PATENT DOCUMENTS

| | | |
|---|---|---|
| CN | 101383438 A | 3/2009 |
| CN | 101981750 A | 2/2011 |

(Continued)

OTHER PUBLICATIONS

Office Action dated Jun. 20, 2023, issued in corresponding Chinese Patent Application No. 202080004778.3.
(Continued)

*Primary Examiner* — Brent A. Fairbanks
(74) *Attorney, Agent, or Firm* — Morgan, Lewis & Bockius LLP

(57) ABSTRACT

An apparatus for determining a degradation state of a battery includes a sensing unit configured to output sensing information indicating a voltage and a current of the battery and a control unit. The control unit determines a degradation ratio of the battery and a measured Q-dV/dQ curve based on the sensing information. The measured Q-dV/dQ curve shows a relationship between a remaining capacity of the battery and a ratio of a change in voltage of the battery to a change in remaining capacity of the battery. The control unit detects a plurality of feature points from the measured Q-dV/dQ curve. The control unit determines a positive electrode degradation ratio, a negative electrode degradation ratio and a lithium ion loss ratio of the battery based on the degradation ratio, the plurality of feature points, a predeter-
(Continued)

mined positive electrode Q-dV/dQ curve and a predetermined negative electrode Q-dV/dQ curve.

18 Claims, 12 Drawing Sheets

(51) Int. Cl.
  *G01R 31/3842* (2019.01)
  *G01R 31/396* (2019.01)
  *H01M 10/48* (2006.01)

(56) References Cited

U.S. PATENT DOCUMENTS

| | | | |
|---|---|---|---|
| 2012/0105068 A1* | 5/2012 | Wang | H01M 10/0525 324/427 |
| 2012/0105069 A1* | 5/2012 | Wang | G01R 31/392 324/427 |
| 2012/0116701 A1 | 5/2012 | Yuasa | |
| 2013/0030739 A1 | 1/2013 | Takahashi et al. | |
| 2013/0099794 A1 | 4/2013 | Takahashi et al. | |
| 2013/0119940 A1 | 5/2013 | Iriyama et al. | |
| 2015/0200425 A1 | 7/2015 | Iriyama et al. | |
| 2016/0061908 A1 | 3/2016 | Torai et al. | |
| 2017/0170672 A1* | 6/2017 | Yebka | H01M 10/486 |
| 2017/0212170 A1* | 7/2017 | Torai | H01M 10/482 |
| 2017/0234930 A1 | 8/2017 | Lee et al. | |
| 2018/0038917 A1 | 2/2018 | Fukuda et al. | |
| 2019/0079136 A1 | 3/2019 | Lim et al. | |
| 2020/0018799 A1 | 1/2020 | Lim et al. | |
| 2020/0099235 A1* | 3/2020 | Ito | G01R 31/3835 |
| 2020/0295410 A1 | 9/2020 | Hong et al. | |
| 2020/0393518 A1* | 12/2020 | Takegami | G01R 31/392 |

FOREIGN PATENT DOCUMENTS

| | | |
|---|---|---|
| CN | 102472794 A | 5/2012 |
| CN | 102834727 A | 12/2012 |
| CN | 103053066 A | 4/2013 |
| CN | 108279382 A | 7/2018 |
| EP | 2053414 A2 | 4/2009 |
| JP | 2009-252381 A | 10/2009 |
| JP | 4884404 B2 | 2/2012 |
| JP | 2013-196805 A | 9/2013 |
| JP | 5558349 B2 | 7/2014 |
| JP | 2016-053564 A | 4/2016 |
| JP | 5940145 B2 | 6/2016 |
| JP | 6123844 B2 | 5/2017 |
| JP | 2017-129493 A | 7/2017 |
| JP | 2018-205138 A | 12/2018 |
| JP | 2019-045351 A | 3/2019 |
| JP | 6490882 B1 | 3/2019 |
| KR | 10-2012-0140671 A | 12/2012 |
| KR | 10-2017-0009995 A | 1/2017 |
| KR | 10-1725514 B1 | 4/2017 |
| KR | 10-2018-0023632 A | 3/2018 |
| KR | 10-1897859 B1 | 9/2018 |
| KR | 10-2019-0036982 A | 4/2019 |
| WO | 2019/013536 A1 | 1/2019 |

OTHER PUBLICATIONS

International Search Report (with partial translation) and Written Opinion issued in corresponding International Patent Application No. PCT/KR2020/004981, dated Jul. 22, 2020.

Extended European Search Report dated Nov. 11, 2021 issued by the European Patent Office for corresponding European patent application No. 20790762.7.

John Wang et al., "Degradation of lithium ion batteries employing graphite negatives and nickel-cobalt-manganese oxide + spinel manganese oxide positives: Part 1, aging mechanisms and life estimation," Journal of Power Sources, vol. 269, 2014, pp. 934-948.

Kohei Honkura et al., "Study of the deterioration mechanism of LiCoO2/graphite cells in charge/discharge cycles using the discharge curve analysis," Journal of Power Sources, vol. 264, 2014, pp. 140-146.

* cited by examiner

FIG. 10

| First record | Second record | Third record |
|---|---|---|
| $Q_{m1}$ | $Q_{e1}$ | $Q_{E1}$ |
| $Q_{m2}$ | $Q_{e2}$ | $Q_{E2}$ |
| $Q_{m3}$ | $Q_{e3}$ | $Q_{E3}$ |
| $Q_{m4}$ | $Q_{e4}$ | $Q_{E4}$ |
| $Q_{m5}$ | $Q_{e5}$ | $Q_{E5}$ |
| $Q_{m6}$ | $Q_{e6}$ | $Q_{E6}$ |

1000

APPARATUS AND METHOD FOR DETERMINING DEGRADATION STATE OF BATTERY, BATTERY PACK AND ELECTRIC VEHICLE

TECHNICAL FIELD

The present disclosure relates to technology for determining each of a positive electrode degradation ratio, a negative electrode degradation ratio and a lithium degradation ratio of a battery.

The present application claims priority to Korean Patent Application No. 10-2019-0044969 filed in the Republic of Korea on Apr. 17, 2019, the disclosure of which is incorporated herein by reference.

BACKGROUND ART

Recently, there has been dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

There are a variety of techniques for diagnosing a degradation state of batteries. For example, Patent Literature discloses acquiring information associated with degradation state of a battery from a Q-dV/dQ curve of the battery using differential Voltage Analysis (may be referred to as 'DVA'). The Q-dV/dQ curve may be represented as a graph having a Q axis and a dV/dQ axis, in which Q denotes a remaining capacity, V denotes a voltage, dV denotes a change in V over a predetermined period of time, dQ denotes a change in Q over the predetermined period of time, and dV/dQ denotes a ratio of dV to dQ.

However, the technology disclosed by the above-described Patent Literature cannot determine a positive electrode degradation ratio, a negative electrode degradation ratio and a lithium ion loss ratio, respectivly indicating the degradation state of the battery.

(Patent Literature) Japanese Patent Publication No. 2009-252381 (published on Oct. 29, 2009)

DISCLOSURE

Technical Problem

The present disclosure is designed to solve the above-described problem, and therefore the present disclosure is directed to providing an apparatus and method for determining a positive electrode degradation ratio, a negative electrode degradation ratio and a lithium ion loss ratio respectivly indicating the degradation state of a battery, a battery pack including the apparatus and an electric vehicle including the battery pack.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

An apparatus according to an aspect of the present disclosure is for determining a degradation state of a battery. The apparatus includes a sensing unit configured to output sensing information indicating a voltage and a current of the battery, and a control unit operably coupled to the sensing unit. The control unit is configured to determine a degradation ratio of the battery and a measured Q-dV/dQ curve based on the sensing information. The measured Q-dV/dQ curve shows a relationship between a remaining capacity of the battery and a ratio of a change in voltage of the battery to a change in remaining capacity of the battery. The control unit is configured to detect a first plurality of feature points from the measured Q-dV/dQ curve. The control unit is configured to determine a positive electrode degradation ratio, a negative electrode degradation ratio and a lithium ion loss ratio of the battery based on the determined degradation ratio, the first plurality of feature points, a predetermined positive electrode Q-dV/dQ curve and a predetermined negative electrode Q-dV/dQ curve.

The control unit may be configured to generate a plurality of adjustment ratio sets based on the determined degradation ratio. Each adjustment ratio set includes a first adjustment ratio, a second adjustment ratio and a third adjustment ratio. A sum of the first adjustment ratio, the second adjustment ratio and the third adjustment ratio included in each adjustment ratio set may be equal to the determined degradation ratio. The control unit may be configured to determine an estimated Q-dV/dQ curve associated with each adjustment ratio set from the positive electrode Q-dV/dQ curve and the negative electrode Q-dV/dQ curve based on the first adjustment ratio, the second adjustment ratio and the third adjustment ratio included in each adjustment ratio set. The control unit may be configured to detect a second plurality of feature points associated with each adjustment ratio set from the estimated Q-dV/dQ curve associated with each adjustment ratio set. The control unit may be configured to determine the positive electrode degradation ratio, the negative electrode degradation ratio and the lithium ion loss ratio based on the first plurality of feature points and the second plurality of feature points associated with each adjustment ratio set.

The control unit may be configured to transform the positive electrode Q-dV/dQ curve into a corrected positive electrode Q-dV/dQ curve associated with each adjustment ratio set based on the first adjustment ratio included in each adjustment ratio set. The control unit may be configured to transform the negative electrode Q-dV/dQ curve into a corrected negative electrode Q-dV/dQ curve associated with each adjustment ratio set based on the second adjustment ratio and the third adjustment ratio included in each adjustment ratio set. The control unit may be configured to generate the estimated Q-dV/dQ curve associated with each adjustment ratio set based on the corrected positive electrode Q-dV/dQ curve and the corrected negative electrode Q-dV/dQ curve associated with each adjustment ratio set. The corrected positive electrode Q-dV/dQ curve associated with each adjustment ratio set may be generated by compressing the positive electrode Q-dV/dQ curve in a first direction along a Q axis as much as the first adjustment ratio included in each adjustment ratio set. The first direction is a direction in which the remaining capacity of the Q axis decreases. The corrected negative electrode Q-dV/dQ curve associated with each adjustment ratio set may be generated by compressing the negative electrode Q-dV/dQ curve in the first direction along the Q axis as much as the second adjustment ratio included in each adjustment ratio set and shifting in a second direction opposite the first direction along the Q axis as much as the third adjustment ratio included in each adjustment ratio set.

The control unit may be configured to determine a sum of absolute values of differences between the remaining capacity of each of the first plurality of feature points and the remaining capacity of each of the second plurality of feature points associated with each adjustment ratio set, as a similarity index associated with each adjustment ratio set. The control unit may be configured to determine the first adjustment ratio, the second adjustment ratio and the third adjustment ratio included in the adjustment ratio set associated with a minimum similarity index among the plurality of similarity indices associated with the plurality of adjustment ratio sets in a one-to-one relationship as the positive electrode degradation ratio, the negative electrode degradation ratio and the lithium ion loss ratio, respectively.

The control unit may be configured to determine a sum of squares of differences between the remaining capacity of each of the first plurality of feature points and the remaining capacity of each of the second plurality of feature points associated with each adjustment ratio set, as a similarity index associated with each adjustment ratio set. The control unit may be configured to determine the first adjustment ratio, the second adjustment ratio and the third adjustment ratio included in the adjustment ratio set associated with a minimum similarity index among the plurality of similarity indices associated with the plurality of adjustment ratio sets in a one-to-one relationship as the positive electrode degradation ratio, the negative electrode degradation ratio and the lithium ion loss ratio, respectively. At least one of the first plurality of feature points may be a maximum point or a minimum point of the measured Q-dV/dQ curve. At least one of the second plurality of feature points may be a maximum point or a minimum point of the estimated Q-dV/dQ curve. The control unit may be configured to activate a predetermined safety function when a difference between two of the positive electrode degradation ratio, the negative electrode degradation ratio and the lithium ion loss ratio is larger than a threshold.

The control unit may be configured to select a candidate threshold associated with the determined degradation ratio from a diagnosis table in which a correspondence between the degradation ratio and the candidate threshold is recorded. The control unit may be configured to determine the selected candidate threshold as the threshold.

A battery pack according to another aspect of the present disclosure includes the apparatus.

An electric vehicle according to still another aspect of the present disclosure includes the battery pack.

A method according to yet another aspect of the present disclosure is for determining a degradation state of a battery. The method includes determining a degradation ratio of the battery and a measured Q-dV/dQ curve based on sensing information indicating a voltage and a current of the battery. The measured Q-dV/dQ curve shows a relationship of a remaining capacity of the battery and a ratio of a change in voltage of the battery to a change in remaining capacity of the battery. The method further includes detecting a first plurality of feature points from the measured Q-dV/dQ curve, and determining a positive electrode degradation ratio, a negative electrode degradation ratio and a lithium ion loss ratio of the battery based on the determined degradation ratio, the first plurality of feature points, a predetermined positive electrode Q-dV/dQ curve and a predetermined negative electrode Q-dV/dQ curve.

In the method, determining the positive electrode degradation ratio, the negative electrode degradation ratio and the lithium ion loss ratio may include generating a plurality of adjustment ratio sets, each including a first adjustment ratio, a second adjustment ratio and a third adjustment ratio, based on the determined degradation ratio, determining an estimated Q-dV/dQ curve associated with each adjustment ratio set from the positive electrode Q-dV/dQ curve and the negative electrode Q-dV/dQ curve based on the first adjustment ratio, the second adjustment ratio and the third adjustment ratio included in each adjustment ratio set, detecting a second plurality of feature points from the estimated Q-dV/dQ curve associated with each adjustment ratio set, and determining the positive electrode degradation ratio, the negative electrode degradation ratio and the lithium ion loss ratio based on the first plurality of feature points and the second plurality of feature points associated with each adjustment ratio set. A sum of the first adjustment ratio, the second adjustment ratio and the third adjustment ratio included in each adjustment ratio set may be equal to the determined degradation ratio.

In the method, determining the positive electrode degradation ratio, the negative electrode degradation ratio and the lithium ion loss ratio may further include determining a sum of absolute values or a sum of squares of differences between the remaining capacity of each of the first plurality of feature points and the remaining capacity of each of the second plurality of feature points associated with each adjustment ratio set as a similarity index associated with each adjustment ratio set. The first adjustment ratio, the second adjustment ratio and the third adjustment ratio included in the adjustment ratio set associated with a minimum similarity index among the plurality of similarity indices associated with the plurality of adjustment ratio sets in a one-to-one relationship may be determined as the positive electrode degradation ratio, the negative electrode degradation ratio and the lithium ion loss ratio, respectively.

The method may further include activating a predetermined safety function when a difference between two of the positive electrode degradation ratio, the negative electrode degradation ratio and the lithium ion loss ratio is larger than a threshold.

Advantageous Effects

According to at least one of the embodiments of the present disclosure, it is possible to determine each of a positive electrode degradation ratio, a negative electrode degradation ratio and a lithium ion loss ratio respectively indicating the degradation state of a battery.

In addition, it is possible to diagnose whether the battery abnormally degrades based on differences between the positive electrode degradation ratio, the negative electrode degradation ratio and the lithium ion loss ratio.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

FIG. 10 shows an exemplary table used to be referenced in describing an operation of calculating a similarity index associated with each adjustment ratio set.

DETAILED DESCRIPTION

Figure 1:
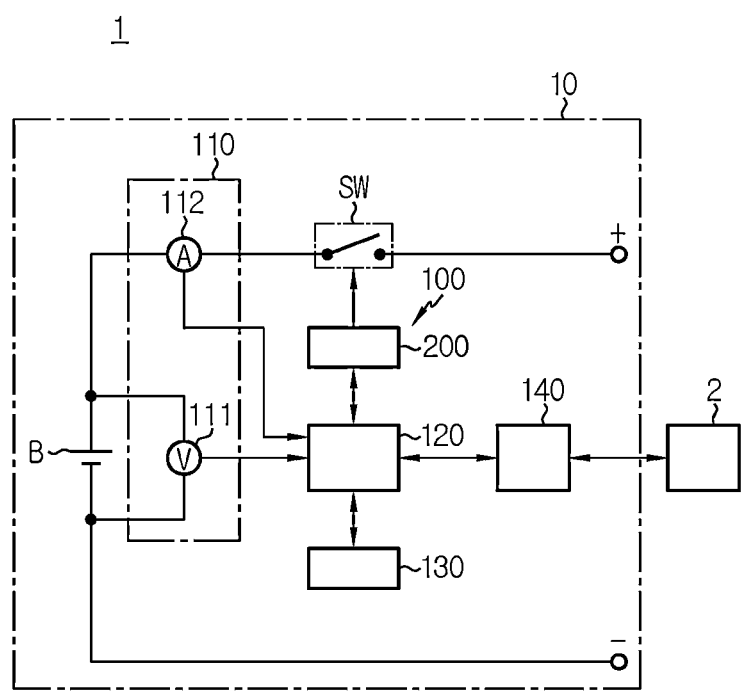
FIG. 1 is a diagram illustrating a configuration of a battery pack according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by either hardware or software or a combination of hardware and software.

In addition, throughout the specification, it will be further understood that when an element is referred to as being "connected to" another element, it can be directly connected to the other element or intervening elements may be present.

Figure 2:
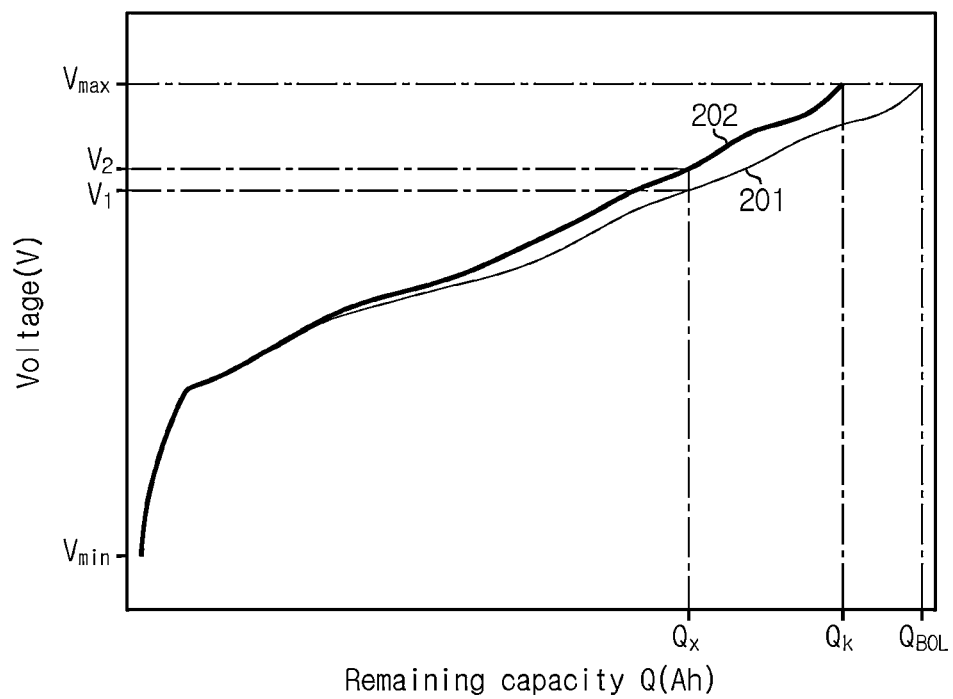
FIG. 2 is a graph illustrating a Q-V curve of a battery at beginning of life and a Q-V curve of a degraded battery.

FIG. 1 is a diagram illustrating a configuration of a battery pack according to an embodiment of the present disclosure, and FIG. 2 is a graph illustrating a Q-V curve of a battery at beginning of life (BOL) and a Q-V curve of a degraded battery.

Referring to FIGS. 1 and 2, the battery pack 10 is provided to be installed in an electric system 1 (for example, an electric vehicle), and includes a battery B, a switch SW and an apparatus 100. The battery B may be a rechargeable battery such as a lithium ion battery.

Positive and negative terminals of the battery B are electrically connected to the apparatus 100.

The switch SW is installed on a current path for charging and discharging of the battery B. The switch SW may be a mechanical relay that is turned on or off by the magnetic force of a coil or a semiconductor switch such as a Metal Oxide Semiconductor Field Effect transistor (MOSFET). While the switch SW is turned on, the battery B may be charged and discharged. While the switch SW is turned off, the charge and discharge of the battery B is stopped. The switch SW may be turned on in response to a first control signal. The switch SW may be turned off in response to a second control signal or when the output of the first control signal is stopped.

The apparatus 100 is provided to determine a state of health (SOH) of the battery B. The apparatus 100 includes a sensing unit 110, a control unit 120 and a memory unit 130. The apparatus 100 may further include an interface unit 140. The apparatus 100 may further include a switch driver 200.

The sensing unit 110 includes a voltage sensor 111 and a current sensor 112. The voltage sensor 111 is electrically connected to the positive and negative terminals of the battery B. The voltage sensor 111 is configured to measure a voltage across the battery B at a predetermined time interval during the charge or discharge of the battery B. The current sensor 112 is installed on the current path of the battery B. The current sensor 112 is configured to measure an electric current flowing through the battery B at the predetermined time interval during the charge or discharge of the battery B. The sensing unit 110 is configured to output, to the control unit 120, sensing information indicating the voltage and the current of the battery B measured in the same cycle by the voltage sensor 111 and the current sensor 112.

The control unit 120 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The control unit 120 is operably coupled to the sensing unit 110. The control unit 120 is configured to determine a remaining capacity of the battery B based on the sensing information from the sensing unit 110. The remaining capacity of the battery B refers to the quantity of charge stored in the battery B.

When the remaining capacity over a range corresponding to a predetermined voltage range (for example, between end-of-discharge voltage $V_{min}$ and end-of-charge voltage $V_{max}$) is determined, the control unit 120 may perform a calculation operation for determining the SOH of the battery B as described below. The end-of-discharge voltage $V_{min}$ may be a voltage (for example, 2.8V) set to prevent the battery B from being overdischarged. The end-of-charge voltage $V_{max}$ may be a voltage (for example, 4.2V) set to prevent the battery B from being overcharged. The maximum capacity of the battery B may be the remaining capacity of the battery B when the voltage of the battery B reaches the end-of-charge voltage. The maximum capacity of the battery B gradually reduces as the battery B degrades.

The control unit 120 may determine a change in voltage of the battery B and a change in remaining capacity of the battery B at the predetermined time interval. The control unit 120 may store data indicating the voltage V, the remaining capacity Q, the change in voltage dV and the change in remaining capacity dQ of the battery B determined at the predetermined time interval in the memory unit 130. The control unit 120 may determine a ratio dV/dQ of the change in voltage dV to the change in remaining capacity dQ at the time interval, and store the same in the memory unit 130.

When at least one of predetermined event(s) occurs, the control unit 120 may command the switch driver 200 to turn on the switch SW. In other situations, the control unit 120 may command the switch driver 200 to turn off the switch SW.

The memory unit 130 is operably coupled to the control unit 120. The memory unit 130 may be also operably coupled to the sensing unit 110. The memory unit 130 may be configured to store the sensing information from the sensing unit 110. The memory unit 130 may store data and programs required for the calculation operation by the control unit 120. The memory unit 130 may store data indicating the results of the calculation operation by the control unit 120.

The switch driver 200 is electrically coupled to the apparatus 100 and the switch SW. The switch driver 200 is configured to selectively output the first control signal or the second control signal to the switch SW in response to the command from the apparatus The control unit 120 may generate a remaining capacity-voltage curve (hereinafter referred to as a 'measured Q-V curve') 202 from the voltage and the remaining capacity of the battery B associated with a predetermined voltage range stored in the memory unit 130. The measured Q-V curve 202 shows a relationship between the remaining capacity and the voltage of the degraded battery B.

The memory unit 130 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

The interface unit 140 is configured to support wired or wireless communication between the control unit 120 and a high-level controller 2 (for example, an Electronic Control Unit (ECU)) of the electric system 1. The wired communication may be, for example, controller area network (CAN) communication, and the wireless communication may be, for example, Zigbee or Bluetooth communication. The communication protocol is not limited to a particular type, and may include any type of communication protocol that supports the wired or wireless communication between the control unit 120 and the high-level controller 2. The interface unit 140 may include an output device such as a display or a speaker to provide the process results about the SOH of the battery B performed by the control unit 120 in a recognizable form by the user. The interface unit 140 may include an input device such as a mouse and a keyboard to receive an input of data from the user.

The maximum capacity of the battery B is a parameter that gradually reduces as the battery B degrades, and may refer to the quantity of charge stored in the battery B when the battery B is fully charged.

In detail, at the predetermined charge end voltage $V_{max}$, the remaining capacity $Q_k$ of the measured Q-V curve 202 (i.e., the maximum capacity of the degraded battery B) is smaller than the remaining capacity $Q_{BOL}$ of the Q-V curve 201 at BOL. The remaining capacity $Q_{BOL}$ denotes the maximum capacity of the battery B at BOL where the battery B was new.

At a specific remaining capacity $Q_x$, a voltage $V_1$ of the Q-V curve 201 at BOL is lower than a voltage $V_2$ of the measured Q-V curve 202. That is, in the same charge condition (or the same discharge condition), as the battery B degrades, the voltage of the battery B changes quickly.

The control unit 120 may determine the degradation ratio of the battery B based on a difference between the remaining capacity $Q_{BOL}$ and the remaining capacity $Q_k$. The degradation ratio of the battery B at a specific time point indicates how much the maximum capacity $Q_k$ of the battery B at the specific time point is reduced from the maximum capacity $Q_{BOL}$. The control unit 120 may determine the degradation ratio of the battery B using the following Equation 1.

$$D_k = \frac{Q_{BOL} - Q_k}{Q_{BOL}} \times 100(\%) \qquad <\text{Equation 1}>$$

In Equation 1, $Q_{BOL}$ denotes the maximum capacity at BOL, $Q_k$ denotes the maximum capacity of the battery B at the specific time point, and $D_k$ denotes the degradation ratio of the battery B at the specific time point. For example, when $Q_{BOL}$ is 50 Ah, and $Q_k$ is 45 Ah, $D_k$ is 10%.

The degradation ratio of the battery B is defined by a positive electrode degradation ratio, a negative electrode degradation ratio and a lithium ion loss ratio of the battery B. That is, the degradation ratio of the battery B relies on the positive electrode degradation ratio, the negative electrode degradation ratio and the lithium ion loss ratio of the battery B, respectively.

One of the causes of degradation of the positive electrode is a reduction in the reactive area of the positive electrode. The positive electrode degradation ratio indicates how much the maximum amount of lithium ions that can be intercalated or deintercalated in the positive electrode of the degraded battery B is reduced compared to the maximum amount of lithium ions that can be intercalated or deintercalated in the positive electrode of the battery B at BOL.

One of the causes of degradation of the negative electrode is a reduction in the reactive area of the negative electrode. The negative electrode degradation ratio indicates how much the maximum amount of lithium ions that can be intercalated or deintercalated in the negative electrode of the degraded battery B is reduced compared to the maximum amount of lithium ions that can be intercalated or deintercalated in the negative electrode of the battery B at BOL.

The lithium ion loss ratio indicates how much the total amount of lithium ions that can contribute to the charge/discharge reaction in the degraded battery B is reduced from the total amount of lithium ions that can contribute to the charge/discharge reaction in the battery B at BOL. For example, with the increasing amount of metal lithium deposited on the negative electrode of the battery B, the negative electrode degradation ratio and the lithium ion loss ratio increase.

For example, the sum (for example, 10%) of the positive electrode degradation ratio (for example, 8%), the negative electrode degradation ratio (for example, 1%) and the lithium ion loss ratio (for example, 1%) of the battery B may be equal to the degradation ratio of the battery B (see Equation 1).

The control unit 120 uses a differential voltage curve of a positive half cell (hereinafter referred to as a 'positive electrode Q-dV/dQ curve') and a differential voltage curve of a negative half cell (hereinafter referred to as a 'negative electrode Q-dV/dQ curve') to determine each of the positive electrode degradation ratio, the negative electrode degradation ratio and the lithium ion loss ratio of the battery B based on the degradation ratio of the battery B, and its detailed description will be provided below.

Figure 3:
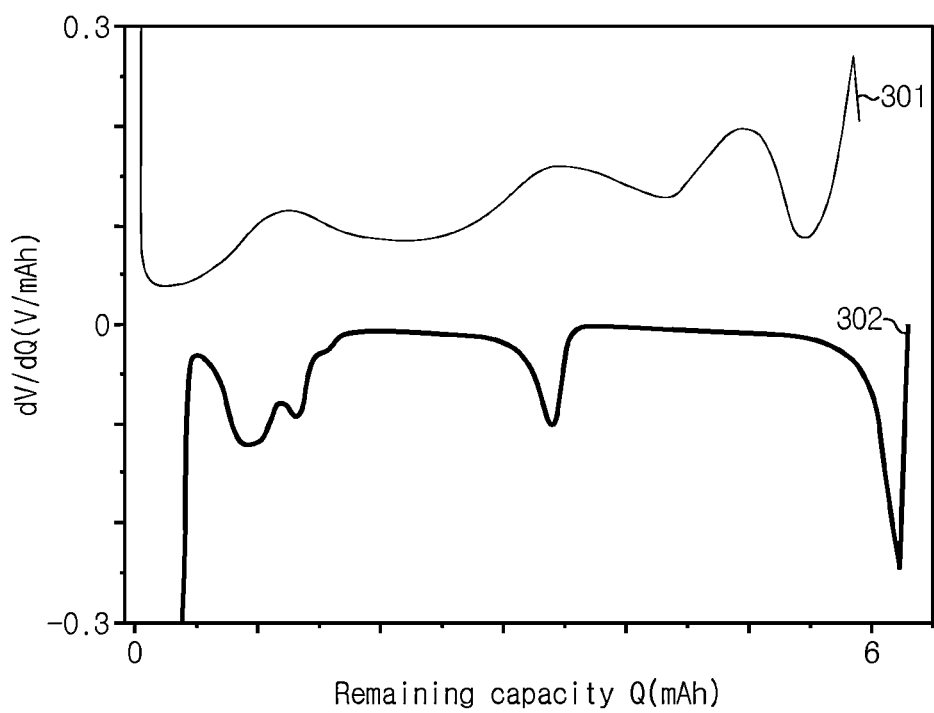
FIG. 3 is a graph illustrating a predetermined positive electrode Q-dV/dQ curve and a predetermined negative electrode Q-dV/dQ curve acquired through a 3-electrode test.

FIG. 3 is a graph illustrating a predetermined positive electrode Q-dV/dQ curve and a predetermined negative electrode Q-dV/dQ curve acquired through a 3-electrode test.

Referring to FIG. 3, the positive electrode Q-dV/dQ curve 301 shows the electrical and chemical properties of the positive electrode of the battery B at BOL, and may be acquired by differentiation of a voltage curve indicating a relationship between the remaining capacity and the voltage of the positive half cell having the same active material as the positive electrode of the battery B with respect to the remaining capacity.

The negative electrode Q-dV/dQ curve 302 shows the electrical and chemical properties of the negative electrode of the battery B at BOL, and may be acquired by differentiation of a voltage curve indicating a relationship between the remaining capacity and the voltage of the negative half cell having the same active material as the negative electrode of the battery B with respect to remaining capacity.

In the case of the positive half cell, as the remaining capacity increases, the voltage of the positive half cell increases. Accordingly, the positive electrode Q-dV/dQ curve 301 is located in the range in which dV/dQ is 0 V/mAh or above. In contrast, in the case of the negative half cell, as the remaining capacity increases, the voltage of the negative half cell decreases. Accordingly, the negative electrode Q-dV/dQ curve 302 is located in the range in which dV/dQ is 0 V/mAh or less. Data indicating the positive electrode Q-dV/dQ curve 301 and the negative electrode Q-dV/dQ curve 302 may be pre-stored in the memory unit 130.

The inventor recognized that a combination of the positive electrode Q-dV/dQ curve 301 and the negative electrode Q-dV/dQ curve 302 substantially matches a Q-dV/dQ curve of a full cell. Substantially matching represents that completely matching or being negligibly different.

When the degradation ratio of the battery B is determined, the control unit 120 generates a plurality of adjustment ratio sets based on the determined degradation ratio. The plurality of adjustment ratio sets is used to correct at least one of the positive electrode Q-dV/dQ curve 301 and the negative electrode Q-dV/dQ curve 302.

Each adjustment ratio set includes a first adjustment ratio, a second adjustment ratio and a third adjustment ratio. The first adjustment ratio, the second adjustment ratio and the third adjustment ratio included in respective adjustment ratio set may be set by the control unit 120 such that the sum of the first adjustment ratio, the second adjustment ratio and the third adjustment ratio is equal to the degradation ratio. For example, when the degradation ratio is 10%, the first adjustment ratio, the second adjustment ratio and the third adjustment ratio included in any one of the plurality of adjustment ratio sets may be 10%, 0%, 0% respectively, the first adjustment ratio, the second adjustment ratio and the third adjustment ratio included in other adjustment ratio set may be 3%, 3%, 4% respectively, and the first adjustment ratio, the second adjustment ratio and the third adjustment ratio included in another adjustment ratio set may be 0%, 4%, 6% respectively. Of course, when the sum of the first adjustment ratio, the second adjustment ratio and the third adjustment ratio is equal to the degradation ratio, other combinations of the first adjustment ratio, the second adjustment ratio and the third adjustment ratio may be contemplated. For example, when the degradation ratio of the battery B is 10% and each adjustment ratio can be adjusted by 1%, a maximum of 66 adjustment ratio sets may be generated.

In each adjustment ratio set, the first adjustment ratio is a candidate value that may be determined as the positive electrode degradation ratio of the degraded battery B. In each adjustment ratio set, the second adjustment ratio is a candidate value that may be determined as the negative electrode degradation ratio of the degraded battery B. In each adjustment ratio set, the third adjustment ratio is a candidate value that may be determined as the lithium ion loss ratio of the degraded battery B.

Figure 4:
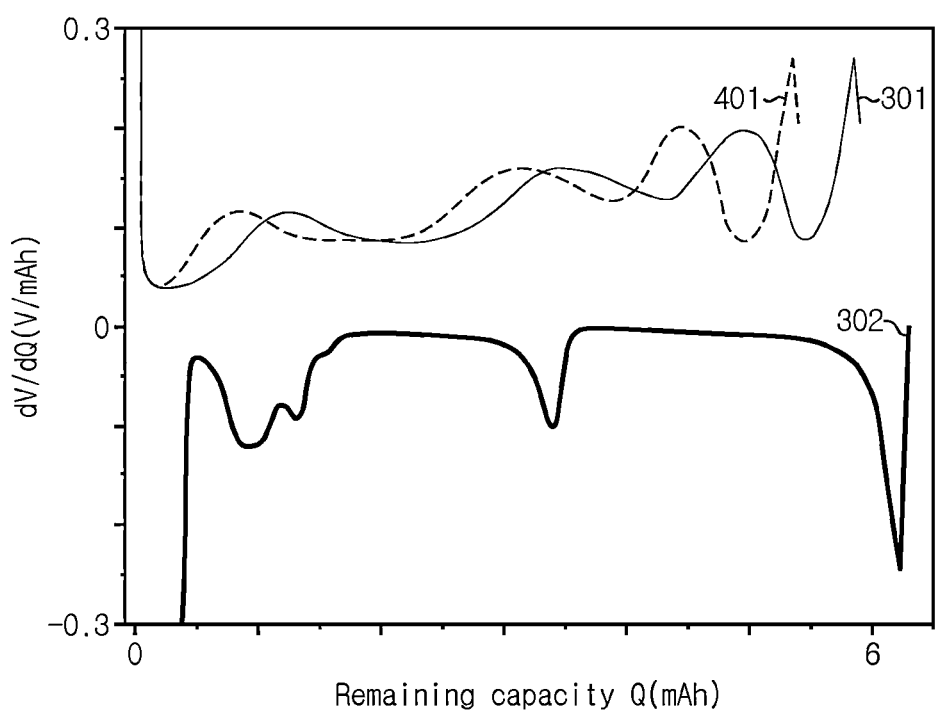
FIG. 4 is a graph illustrating a relationship between the positive electrode Q-dV/dQ curve of FIG. 3 and a positive electrode degradation ratio.

FIG. 4 is a graph illustrating a relationship between the positive electrode Q-dV/dQ curve of FIG. 3 and the positive electrode degradation ratio.

The control unit 120 may correct the positive electrode Q-dV/dQ curve 301 of FIG. 3 based on the first adjustment ratio of each adjustment ratio set. The first adjustment ratio of each adjustment ratio set is a candidate value for determining the positive electrode degradation ratio of the battery B, and is determined below the degradation ratio of the battery B.

Referring to FIGS. 3 and 4, the control unit 120 generates a corrected positive electrode Q-dV/dQ curve 401 by compressing (shrinking) the positive electrode Q-dV/dQ curve 301 as much as the first adjustment ratio in a first direction (leftward) along the Q axis. The positive electrode Q-dV/dQ curve 301 and the corrected positive electrode Q-dV/dQ curve 401 may have a relationship of the following Equation 2.

$$f_{P1}(Q \times (100-X)/100) = f_P(Q)$$  <Equation 2>

In Equation 2, X is the first adjustment ratio. $f_P(Q)$ denotes dV/dQ of the positive electrode Q-dV/dQ curve 301 corresponding to the remaining capacity Q. $f_{P1}(Q)$ denotes dV/dQ of the corrected positive electrode Q-dV/dQ curve 401 corresponding to the remaining capacity Q. For example, where X=10%, Q=3 mAh, $f_P(3\ mAh)=f_{P1}(2.7\ mAh)$.

The relationship between the positive electrode Q-dV/dQ curve 301 and the first adjustment ratio is not defined by Equation 2, and may be preset as a different relationship from Equation 2 depending on the specification of the battery B (for example, the type of the electrode material and the active material, the maximum capacity at BOL).

Figure 5:
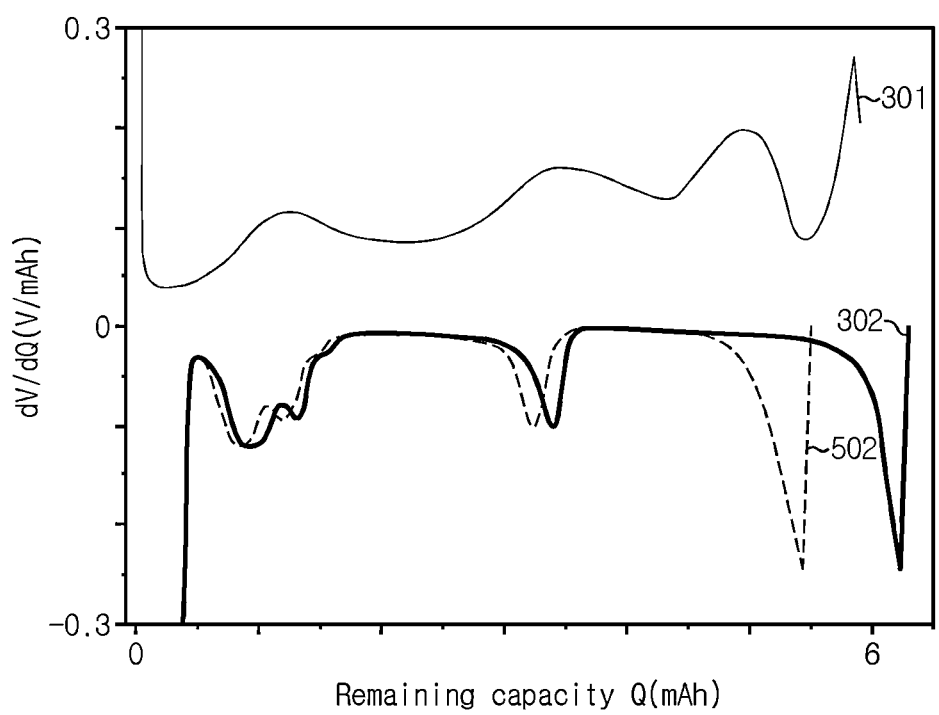
FIG. 5 is a graph illustrating a relationship between the negative electrode Q-dV/dQ curve of FIG. 3 and a negative electrode degradation ratio.

FIG. 5 is a graph illustrating a relationship between the negative electrode Q-dV/dQ curve of FIG. 3 and the negative electrode degradation ratio.

The control unit 120 may correct the negative electrode Q-dV/dQ curve 302 of FIG. 3 based on the second adjustment ratio of each adjustment ratio set. The second adjustment ratio of each adjustment ratio set is a candidate value for determining the negative electrode degradation ratio of the battery B, and is determined below the degradation ratio of the battery B.

Referring to FIGS. 3 and 5, the control unit 120 generates a corrected negative electrode Q-dV/dQ curve 502 by compressing (shrinking) the negative electrode Q-dV/dQ curve 302 as much as the second adjustment ratio in the first direction (leftward) along the Q axis. The negative electrode Q-dV/dQ curve 302 and the corrected negative electrode Q-dV/dQ curve 502 may have a relationship of the following Equation 3.

$$f_{N1}(Q \times (100-Y)/100) = f_N(Q) \qquad <\text{Equation 3}>$$

In Equation 3, Y is the second adjustment ratio. $f_N(Q)$ denotes dV/dQ of the negative electrode Q-dV/dQ curve 302 corresponding to the remaining capacity Q. $f_{N1}(Q)$ denotes dV/dQ of the corrected negative electrode Q-dV/dQ curve 502 corresponding to the remaining capacity Q. For example, where Y=5%, Q=4 mAh, $f_N$(4 mAh)=$f_{N1}$(3.8 mAh).

The relationship between the negative electrode Q-dV/dQ curve 302 and the second adjustment ratio is not defined by Equation 3, and may be preset as a different relationship from Equation 3 depending on the specification of the battery B (for example, the type of the electrode material and the active material, the maximum capacity at BOL).

Figure 6:
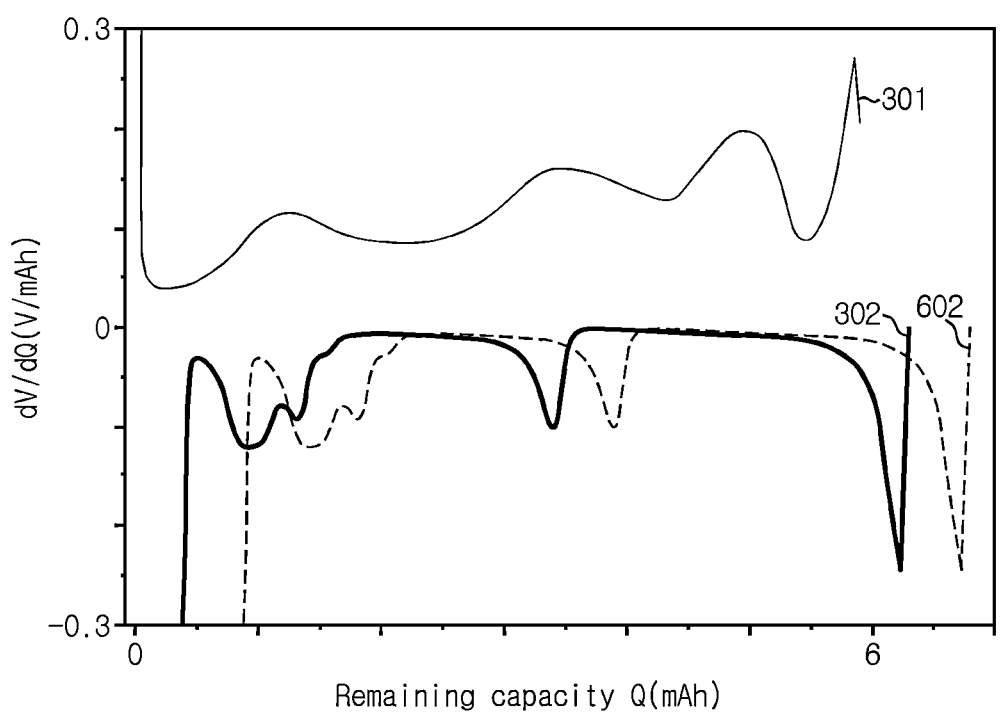
FIG. 6 is a graph illustrating a relationship between the negative electrode Q-dV/dQ curve of FIG. 3 and a lithium ion loss ratio.

FIG. 6 is a graph illustrating a relationship between the negative electrode Q-dV/dQ curve of FIG. 3 and the lithium ion loss ratio.

The control unit 120 may correct the negative electrode Q-dV/dQ curve 302 of FIG. 3 based on the third adjustment ratio of each adjustment ratio set. The third adjustment ratio of each adjustment ratio set is a candidate value for determining the lithium ion loss ratio of the battery B, and is determined below the degradation ratio of the battery B.

Referring to FIGS. 3 and 6, the control unit 120 may generate a corrected negative electrode Q-dV/dQ curve 602 by shifting the negative electrode Q-dV/dQ curve 302 as much as the third adjustment ratio in a second direction (rightward) opposite the first direction along the Q axis. The negative electrode Q-dV/dQ curve 302 and the corrected negative electrode Q-dV/dQ curve 602 may have a relationship of the following Equation 4.

$$f_{N2}(Q+Z/100 \times Q_{max\_N}) = f_N(Q) \qquad <\text{Equation 4}>$$

In Equation 4, Z denotes the third adjustment ratio, and $Q_{max\_N}$ denotes the maximum capacity of the negative half cell. $f_N(Q)$ denotes dV/dQ of the negative electrode Q-dV/dQ curve 302 corresponding to the remaining capacity Q. $f_{N2}(Q)$ denotes dV/dQ of the corrected negative electrode Q-dV/dQ curve 602 corresponding to the remaining capacity Q. For example, where Z=5%, $Q_{max\_N}$=6 mAh, Q=3 mAh, $f_N$(3 mAh)=$f_{N2}$(3.3 mAh).

The relationship between the negative electrode Q-dV/dQ curve 302 and the third adjustment ratio is not defined by Equation 4, and may be preset as a different relationship from Equation 4 depending on the specification of the battery B (for example, the type of the electrode material and the active material, the maximum capacity at BOL).

When the second adjustment ratio is larger than 0% and the third adjustment ratio is larger than 0%, the control unit 120 may generate the corrected negative electrode Q-dV/dQ curve associated with each adjustment ratio set as a result of executing an algorithm that compresses the negative electrode Q-dV/dQ curve 302 as much as the second adjustment ratio of each adjustment ratio set by using Equation 3, and subsequently shifts the negative electrode Q-dV/dQ curve 302 as much as the third adjustment ratio of each adjustment ratio set by using Equation 4.

Alternatively, the control unit 120 may correct the negative electrode Q-dV/dQ curve 302 of FIG. 3 based on the second adjustment ratio and the third adjustment ratio of each adjustment ratio set, irrespective of whether at least one of the second adjustment ratio and the third adjustment ratio included in each adjustment ratio set is 0% or not. In this case, the negative electrode Q-dV/dQ curve 302 and the corrected negative electrode Q-dV/dQ curve (not shown) may have a relationship of the following Equation 5.

$$f_{N3}(Q \times (100-y)/100 + z/100 \times Q_{max\_N}) = f_N(Q) \qquad <\text{Equation 5}>$$

In Equation 5, y and z indicate the second adjustment ratio and the third adjustment ratio of the same adjustment ratio set, respectively. $Q_{max\_N}$ denotes the maximum capacity of the negative half cell. $f_N(Q)$ denotes dV/dQ when the remaining capacity is Q on the negative electrode Q-dV/dQ curve 302. $f_{N3}(Q)$ denotes dV/dQ of the corrected negative electrode Q-dV/dQ curve corresponding to the remaining capacity Q. For example, where y=5%, z=5%, $Q_{max\_N}$=6 mAh, Q=2 mAh, $f_N$(2)=$f_{N3}$(1.9+0.3)=$f_{N3}$(2.2).

When the third adjustment ratio z is 0%, Equation 3 and Equation 5 are equal. When the second adjustment ratio y is 0%, Equation 4 and Equation 5 are equal. The relationship between the negative electrode Q-dV/dQ curve 302, the second adjustment ratio and the third adjustment ratio is not defined by Equation 5, and may be preset as a different relationship from Equation 5 depending on the specification of the battery B (for example, the type of the electrode material and the active material, the maximum capacity at BOL).

According to the foregoing description, the corrected positive electrode Q-dV/dQ curve and the corrected negative electrode Q-dV/dQ curve associated with respective adjustment ratio set are generated by the control unit 120.

The control unit 120 generates an estimated Q-dV/dQ curve associated with each adjustment ratio set by combining the corrected positive electrode Q-dV/dQ curve and the corrected negative electrode Q-dV/dQ curve associated with each adjustment ratio set according to a predetermined rule. For example, the control unit 120 may determine, within a predetermined remaining capacity range, the estimated Q-dV/dQ curve associated with a specific adjustment ratio set by subtracting dV/dQ of the corrected negative electrode Q-dV/dQ curve associated with the specific adjustment ratio set from dV/dQ of the corrected positive electrode Q-dV/dQ curve associated with the specific adjustment ratio set. Accordingly, the same number of estimated Q-dV/dQ curves as the plurality of adjustment ratio sets are generated. That is, the plurality of estimated Q-dV/dQ curves associated with the plurality of adjustment ratio sets in a one-to-one relationship is acquired.

The control unit 120 detects a plurality of feature points from each of the plurality of estimated Q-dV/dQ curves. The control unit 120 determines a similarity index associated with respective adjustment ratio set by comparing a plurality of feature points detected from the measured Q-dV/dQ curve with the plurality of feature points detected from each estimated Q-dV/dQ curve.

Each feature point appearing on the measured Q-dV/dQ curve (see 700 in FIG. 7) may be the maximum point, the minimum point or the last point of the measured Q-dV/dQ curve. For example, a point disposed in a predetermined order among all the extremum points and the last point appearing on the measured Q-dV/dQ curve may be detected as the feature point. Each feature point appearing on each estimated Q-dV/dQ curve may be the maximum point, the minimum point or the last point on each estimated Q-dV/dQ curve. For example, a point disposed in the predetermined order among all the extremum points appearing on the estimated Q-dV/dQ curve may be detected as the feature point.

The control unit 120 may determine the sum of absolute values of differences between the remaining capacity of each of the plurality of feature points detected from the measured Q-dV/dQ curve and the remaining capacity of each of the plurality of feature points detected from respective estimated Q-dV/dQ curve as the similarity index associated with respective adjustment ratio set. The control unit 120 may determine the similarity index associated with each adjustment ratio set using the following Equation 6.

$$S_{sum\_d\_k} = \sum_{i=1}^{N} |Q_{m\_peak}[i] - Q_{e\_peak\_k}[i]| \qquad <\text{Equation 6}>$$

In Equation 6, N denotes the total number of the plurality of feature points detected from each curve, $Q_{m\_peak}[i]$ denotes the remaining capacity of the $i^{th}$ feature point of the measured Q-dV/dQ curve, $Q_{e\_peak\_k}[i]$ denotes the remaining capacity of the $i_{th}$ feature point of the estimated Q-dV/dQ curve associated with the $k^{th}$ adjustment ratio set, and $S_{sum\_d\_k}$ denotes the similarity index associated with the $k^{th}$ adjustment ratio set. For reference, when x is a real number, |x| denotes the absolute value of x.

Alternatively, the control unit 120 may determine the sum of squares of differences between the remaining capacity of each of the plurality of feature points on the measured Q-dV/dQ curve and the remaining capacity of each of the plurality of feature points on each estimated Q-dV/dQ curve as the similarity index associated with each adjustment ratio set. The control unit 120 may determine the similarity index associated with each adjustment ratio set using the following Equation 7.

$$S_{sum\_s\_k} = \sum_{i=1}^{N} (Q_{m\_peak}[i] - Q_{e\_peak\_k}[i])^2 \qquad <\text{Equation 7}>$$

In Equation 7, N denotes the number of the plurality of feature points detected from each curve, $Q_{m\_peak}[i]$ denotes the remaining capacity of the $i^{th}$ feature point of the measured Q-dV/dQ curve, $Q_{e\_peak\_k}[i]$ denotes the remaining capacity of the $i^{th}$ feature point of the estimated Q-dV/dQ curve associated with the $k^{th}$ adjustment ratio set, and $S_{sum\_s\_k}$ denotes the similarity index associated with the $k^{th}$ adjustment ratio set.

The control unit 120 may determine that with the decreasing $S_{sum\_d\_k}$ or $S_{sum\_s\_k}$, the estimated Q-dV/dQ curve associated with the $k^{th}$ adjustment ratio set is similar to the measured Q-dV/dQ curve. For example, where $S_{sum\_s\_2} > S_{sum\_s\_1}$, a first estimated Q-dV/dQ curve associated with the first adjustment ratio set is determine to be more similar to the measured Q-dV/dQ curve than a second estimated Q-dV/dQ curve associated with the second adjustment ratio set.

The control unit 120 may determine the first adjustment ratio, the second adjustment ratio and the third adjustment ratio included in the specific adjustment ratio set associated with the minimum similarity index among the plurality of adjustment ratio sets, as the positive electrode degradation ratio, the negative electrode degradation ratio and the lithium ion loss ratio of the battery B, respectively.

Figure 7:
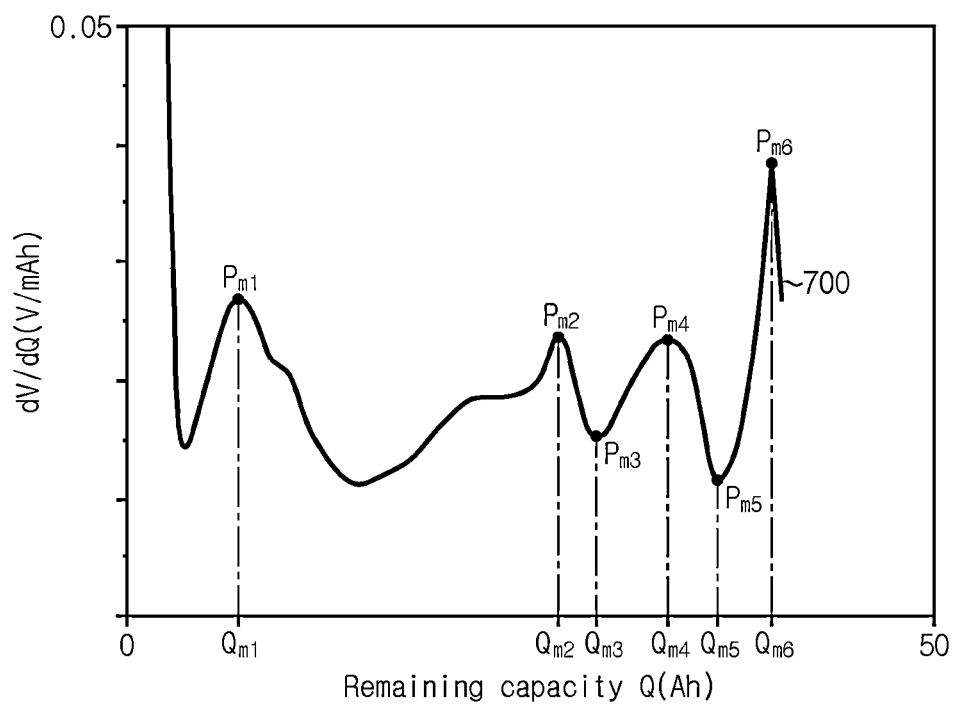
FIG. 7 is a graph illustrating a measured Q-dV/dQ curve associated with the Q-V curve of FIG. 2.
Figure 8:
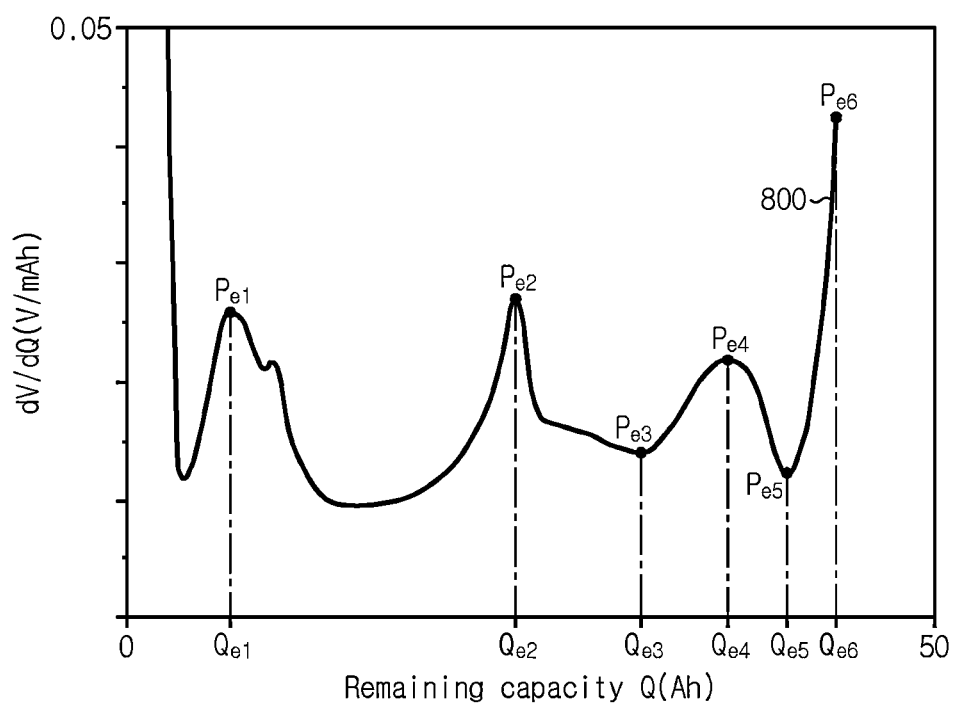
FIGS. 8 and 9 are graphs illustrating two estimated Q-dV/dQ curves associated with different adjustment ratios sets in a one-to-one relationship.
Figure 9:
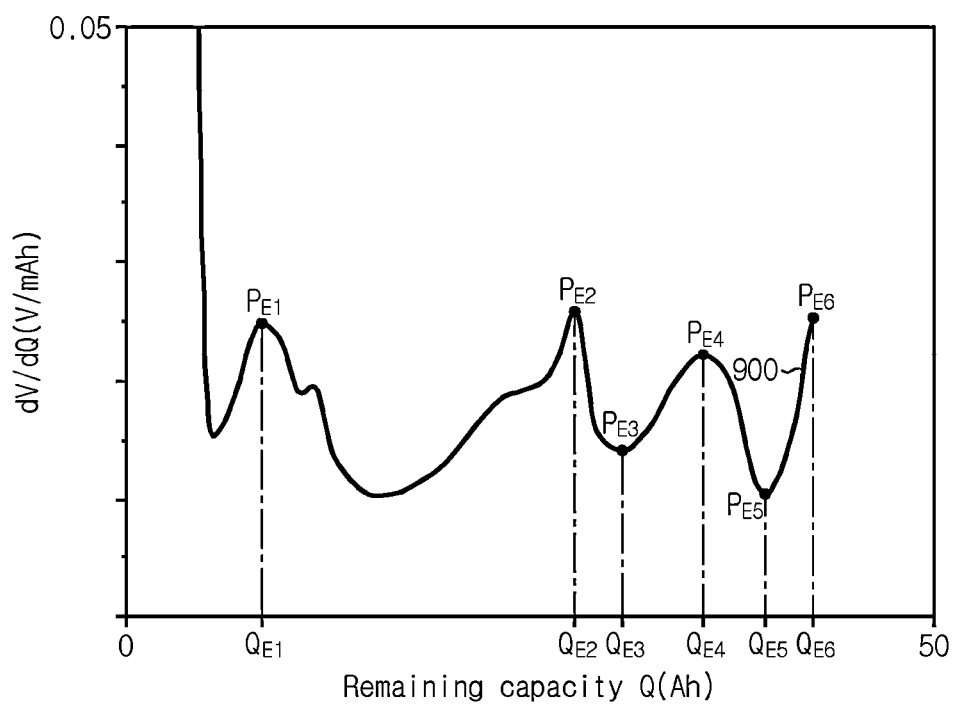

FIG. 7 is a graph illustrating a measured Q-dV/dQ curve associated with the Q-V curve of FIG. 2, FIGS. 8 and 9 are graphs illustrating two estimated Q-dV/dQ curves associated with different adjustment ratios sets in a one-to-one relationship, and FIG. 10 shows an exemplary table used to be referenced in describing an operation of calculating a similarity index associated with each adjustment ratio set.

First, referring to FIG. 7, the control unit 120 may generate the measured Q-dV/dQ curve 700 indicating a relationship between the remaining capacity Q of the battery B, and the ratio dV/dQ of the change in voltage dV to the change in remaining capacity dQ of the battery B, based on the data stored in the memory unit 130. Alternatively, the control unit 120 may generate the measured Q-dV/dQ curve 700 by differentiation of an approximation function obtained by applying a data filter to the measured Q-V curve 202 with respect to the remaining capacity.

The control unit 120 may detect feature points $P_{m1}$, $P_{m2}$, $P_{m3}$, $P_{m4}$, $P_{m5}$, $P_{m6}$ from the measured Q-dV/dQ curve 700. The remaining capacity of the feature points $P_{m1}$, $P_{m2}$, $P_{m3}$, $P_{m4}$, $P_{m5}$, $P_{m6}$ is $Q_{m1}$, $Q_{m2}$, $Q_{m3}$, $Q_{m4}$, $Q_{m5}$, $Q_{m6}$ in that order.

Assume that the estimated Q-dV/dQ curve 800 shown in FIG. 8 is associated with the first adjustment ratio set which is one of the plurality of adjustment ratio sets. The control unit 120 may detect feature points $P_{e1}$, $P_{e2}$, $P_{e3}$, $P_{e4}$, $P_{e5}$, $P_{e6}$ from the estimated Q-dV/dQ curve 800. The feature points match the feature points $P_{e1}$, $P_{e2}$, $P_{e3}$, $P_{e4}$, $P_{e5}$, $P_{e6}$ match the feature points $P_{m1}$, $P_{m2}$, $P_{m3}$, $P_{m4}$, $P_{m4}$, $P_{m5}$, $P_{m6}$ in a one-to-one relationship in that order. The remaining capacity of the feature points $P_{e1}$, $P_{e2}$, $P_{e3}$, $P_{e4}$, $P_{e5}$, $P_{e6}$ is $Q_{e1}$, $Q_{e2}$, $Q_{e3}$, $Q_{e4}$, $Q_{e5}$, $Q_{e6}$ in that order.

The estimated Q-dV/dQ curve 900 shown in FIG. 9 may be associated with the second adjustment ratio set which is one of the remaining adjustment ratio set(s) except the first adjustment ratio set. The control unit 120 may detect feature points $P_{E1}$, $P_{E2}$, $P_{E3}$, $P_{E4}$, $P_{E5}$, $P_{E6}$ from the estimated Q-dV/dQ curve 900. The feature points $P_{E1}$, $P_{E2}$, $P_{E3}$, $P_{E4}$, $P_{E4}$, $P_{E5}$, $P_{E6}$ match the feature points $P_{m1}$, $P_{m2}$, $P_{m3}$, $P_{m4}$, $P_{m5}$, $P_{m6}$ in a one-to-one relationship in that order. The remaining capacity of the feature points $P_{E1}$, $P_{E2}$, $P_{E3}$, $P_{E4}$, $P_{E5}$, $P_{E6}$ is $Q_{E1}$, $Q_{E2}$, $Q_{E3}$, $Q_{E4}$, $Q_{E5}$, $Q_{E6}$ in that order.

The control unit 120 may be configured to detect all feature points appearing on each curve, or may be configured to detect only a predetermined number of feature points disposed in a predetermined order.

Referring to FIGS. 7 to 9, it can be seen that the location of the feature points $P_{m1}$, $P_{m2}$, $P_{m3}$, $P_{m4}$, $P_{m5}$, $P_{m6}$ on the measured Q-dV/dQ curve 700, the location of the feature points $P_{e1}$, $P_{e2}$, $P_{e3}$, $P_{e4}$, $P_{e4}$, $P_{e5}$, $P_{e6}$ on the estimated Q-dV/dQ curve 800, and the location of the feature points $P_{E1}$, $P_{E2}$, $P_{E3}$, $P_{E4}$, $P_{E5}$, $P_{E6}$ on the estimated Q-dV/dQ curve 900 are different from one another.

Referring to FIG. 10, the table 1000 is used to determine the similarity index associated with each adjustment ratio set. The table 1000 is stored in the memory unit 130, and the values of the table 1000 may be recorded as per a request from the control unit 120.

A first record in the table 1000 records the remaining capacity $Q_{m1}$, $Q_{m2}$, $Q_{m3}$, $Q_{m4}$, $Q_{m5}$, $Q_{m6}$) of the feature points $P_{m1}$, $P_{m2}$, $P_{m3}$, $P_{m4}$, $P_{m5}$, $P_{m6}$ appearing on the measured Q-dV/dQ curve 700 in that order.

A second record in the table 1000 records the remaining capacity $Q_{E1}$, $Q_{E2}$, $Q_{E3}$, $Q_{E5}$, $Q_{E6}$ of the feature points appearing on the estimated Q-dV/dQ curve 800 in that order.

A third record in the table 1000 records the remaining capacity $Q_{E1}, Q_{E2}, Q_{E3}, Q_{E4}, Q_{E5}, Q_{E6}$ of the feature points $P_{E1}, P_{E2}, P_{E3}, P_{E4}, P_{E5}, P_{E6}$ appearing on the estimated Q-dV/dQ curve 900 in that order. For example, it can be seen that the remaining capacity of the second feature point of each of the measured Q-dV/dQ curve 700, the estimated Q-dV/dQ curve 800 and the estimated Q-dV/dQ curve 900 is recorded as $Q_{m2}$, $Q_{e2}$ and $Q_{E2}$, respectively.

Of course, the table 1000 may further include at least one additional record to record the remaining capacity of the feature points of the estimated Q-dV/dQ curve associated with the remaining adjustment ratio sets.

Subsequently, the control unit 120 may determine each of the similarity index associated with the first adjustment ratio set and the similarity index associated with the second adjustment ratio set based on the values recorded in the memory unit 130 through the above-described process.

For example, the control unit 120 may determine the sum of absolute values (see Equation 6) or the sum of squares (see Equation 7) of differences between the remaining capacity of each feature point on the measured Q-dV/dQ curve 700 and the remaining capacity of each feature point on the estimated Q-dV/dQ curve 800 as the similarity index associated with the first adjustment ratio set. In the same way, the control unit 120 may determine the sum of absolute values (see Equation 6) or the sum of squares (see Equation 7) of differences between the remaining capacity of each feature point on the measured Q-dV/dQ curve 700 and the remaining capacity of each feature point on the estimated Q-dV/dQ curve 900 as the similarity index associated with the second adjustment ratio set.

When the similarity indices resepctively associated with the plurality of adjustment ratio sets are determined as described above, the control unit 120 may determine the first adjustment ratio, the second adjustment ratio and the third adjustment ratio included in the specific adjustment ratio set associated with the minimum similarity index among the similarity indices associated with the plurality of adjustment ratio sets in a one-to-one relationship, as the positive electrode degradation ratio, the negative electrode degradation ratio and the lithium ion loss ratio, respectively.

The control unit 120 may transmit a diagnosis message indicating the positive electrode degradation ratio, the negative electrode degradation ratio and the lithium ion loss ratio defining the degradation ratio of the battery B to the high-level controller 2 through the interface unit 140, output it in a recognizable form (for example, an image, a sound) by the user, or store it in the memory unit 130.

When a difference between two (for example, the positive electrode degradation ratio and the negative electrode degradation ratio) of the positive electrode degradation ratio, the negative electrode degradation ratio and the lithium ion loss ratio is larger than the threshold, it indicates that one or two of the positive electrode degradation ratio, the negative electrode degradation ratio and the lithium ion loss ratio are abnormally large. The reason is because when the battery B normally degrades, the positive electrode degradation ratio, the negative electrode degradation ratio and the lithium ion loss ratio increase on similar levels. When the difference between two (for example, the positive electrode degradation ratio and the negative electrode degradation ratio) of the positive electrode degradation ratio, the negative electrode degradation ratio and the lithium ion loss ratio is larger than the threshold, the control unit 120 may activate a predetermined safety function to prevent a danger caused by abnormal degradation of the battery B.

Figure 11:
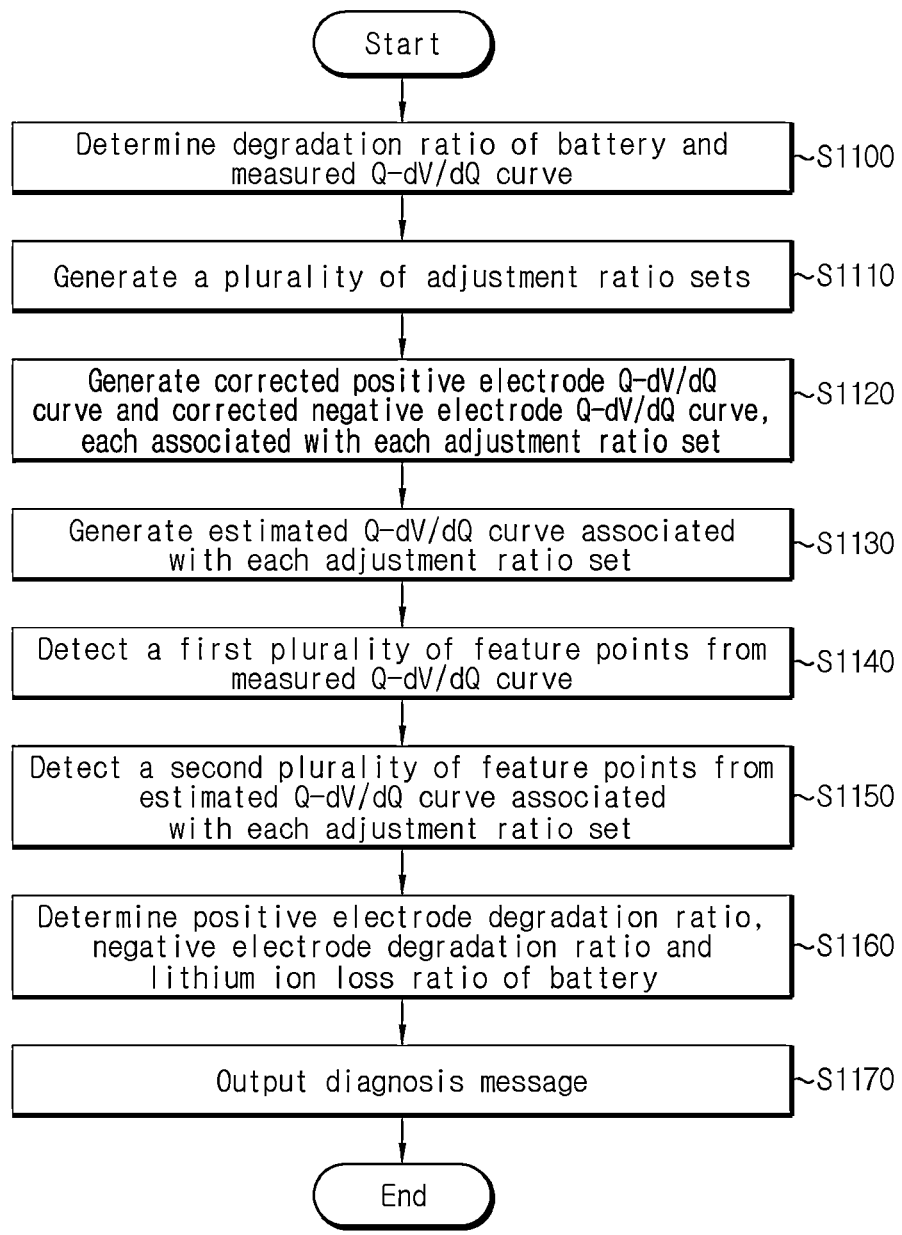
FIG. 11 is a flowchart illustrating a method for determining a degradation state of a battery according to the present disclosure.

FIG. 11 is a flowchart illustrating a method for determining the SOH of the battery according to the present disclosure.

Referring to FIGS. 1 to 11, in step S1100, the control unit 120 determines a degradation ratio of the battery and a measured Q-dV/dQ curve based on sensing information from the sensing unit 110.

In step S1110, the control unit 120 generates a plurality of adjustment ratio sets based on the degradation ratio of the battery.

In step S1120, the control unit 120 generates a corrected positive electrode Q-dV/dQ curve and a corrected negative electrode Q-dV/dQ curve, each associated with each adjustment ratio set.

In step S1130, the control unit 120 generates an estimated Q-dV/dQ curve associated with each adjustment ratio set. The estimated Q-dV/dQ curve associated with a specific adjustment ratio set may be a combination of the corrected positive electrode Q-dV/dQ curve and the corrected negative electrode Q-dV/dQ curve respectively associated with the specific adjustment ratio set according to a predetermined rule.

In step S1140, the control unit 120 detects a first plurality of feature points from the measured Q-dV/dQ curve (see FIG. 7).

In step S1150, the control unit 120 detects a second plurality of feature points from the estimated Q-dV/dQ curve associated with each adjustment ratio set (see FIGS. 8 and 9).

In step S1160, the control unit 120 determines a positive electrode degradation ratio, a negative electrode degradation ratio and a lithium ion loss ratio of the battery B based on the first plurality of feature points and the second plurality of feature points each associated with the plurality of adjustment ratio sets.

In step S1170, the control unit 120 outputs a diagnosis message indicating the positive electrode degradation ratio, the negative electrode degradation ratio and the lithium ion loss ratio of the battery B.

Figure 12:
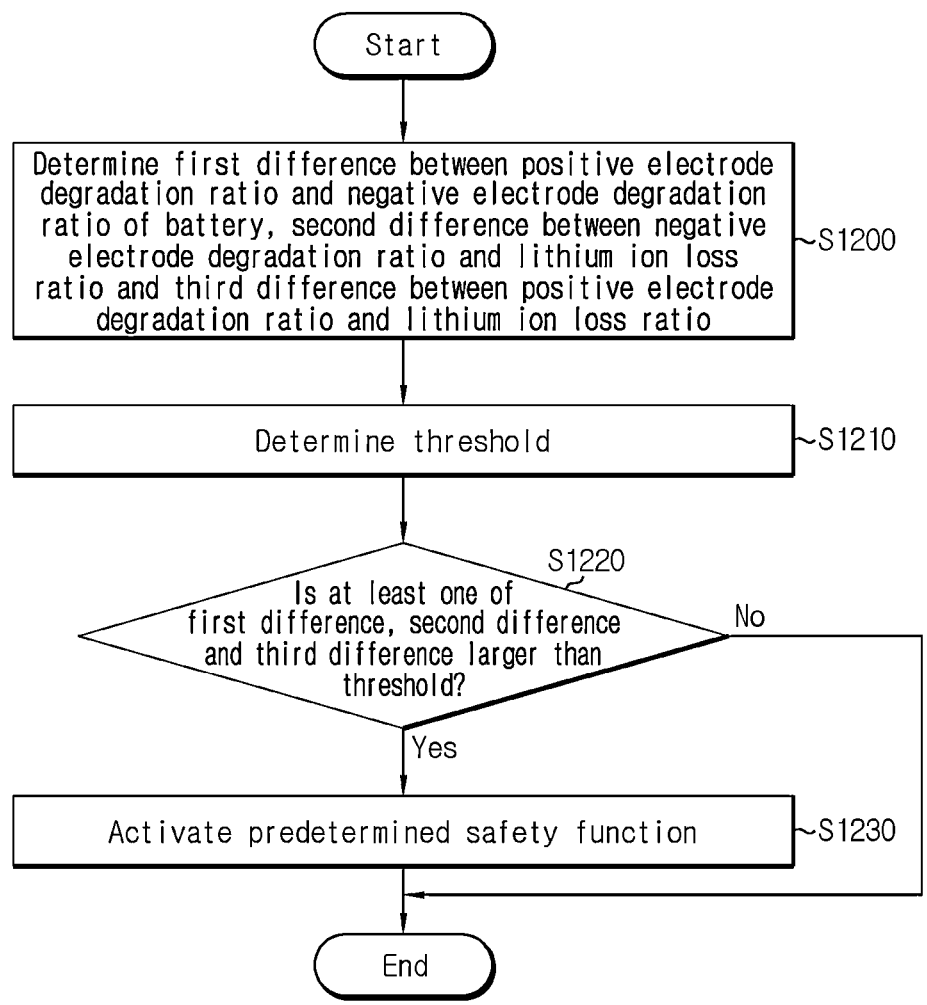
FIG. 12 is a flowchart illustrating a method for controlling a battery according to the present disclosure.

FIG. 12 is a flowchart illustrating a method for controlling a battery according to the present disclosure. The method of FIG. 12 may be performed after the degradation ratio of the battery B, the positive electrode degradation ratio, the negative electrode degradation ratio and the lithium ion loss ratio are determined through the method of FIG. 11.

In step S1200, the control unit 120 determines a first difference between the positive electrode degradation ratio and the negative electrode degradation ratio of the battery B, a second difference between the negative electrode degradation ratio and the lithium ion loss ratio and a third difference between the positive electrode degradation ratio and the lithium ion loss ratio.

In step S1210, the control unit 120 determines a threshold based on the degradation ratio of the battery B. A table (referred to as a 'diagnosis table') that records data indicating a correspondence between the degradation ratio of the battery B and a candidate threshold may be pre-stored in the memory unit 130. The control unit 120 may select the candidate threshold associated with the degradation ratio determined in the step S1100 from the diagnosis table by using the degradation ratio of the battery B determined in the step S1100 as an index. Within the diagnosis table, a smaller degradation ratio may be associated with a larger candidate threshold. Alternatively, a predetermined value may be used as the threshold, and in this case, the step S1210 may be omitted.

In step S1220, the control unit 120 determines whether at least one of the first difference, the second difference and the third difference is larger than the threshold. A value of the step S1220 being "YES" may represent that the battery B abnormally degraded. When the value of the step S1220 is "NO", step S1230 is performed. When the value of the step S1220 is "NO", the method may end.

In step S1230, the control unit 120 activates a predetermined safety function. The safety function may be to output a warning message or regulate the charge/discharge current. The warning message indicates that the battery B abnormally degraded, and may be transmitted to the high-level controller 2 of the electric system 1 through the interface unit 140, or outputted in the form of an image or a sound by the interface unit 140. The control unit 120 may command a switching device 200 to regulate the charge/discharge current flowing through the switch SW below a predetermined current. The switching device 200 may regulate the charge/discharge current flowing through the switch SW below the predetermined current by outputting the second control signal to the switch SW or reducing the duty cycle of the first control signal below a predetermined limit value (for example, 10%).

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. An apparatus for determining a degradation state of a battery, comprising:
   a sensing unit configured to output sensing information indicating a voltage and a current of the battery; and
   a control unit operably coupled to the sensing unit, the control unit being configured to:
      determine a degradation ratio of the battery and a measured Q-dV/dQ curve, based on the sensing information, the measured Q-dV/dQ curve indicating a relationship between a remaining capacity of the battery and a ratio of a change in the voltage of the battery to a change in the remaining capacity of the battery;
      generate a plurality of adjustment ratio sets based on the determined degradation ratio, each adjustment ratio set including a plurality of adjustment ratios;
      detect a first plurality of feature points from the measured Q-dV/dQ curve;
      determine a positive electrode degradation ratio, a negative electrode degradation ratio and a lithium ion loss ratio of the battery, based on the determined degradation ratio, the first plurality of feature points, a predetermined positive electrode Q-dV/dQ curve, a predetermined negative electrode Q-dV/dQ curve, and the plurality of adjustment ratio sets; and
      regulate a charge or discharge current of the battery based on the positive electrode degradation ratio, the negative electrode degradation ratio, and the lithium ion loss ratio of the battery,
   where:
      Q denotes the remaining capacity of the battery,
      V denotes the voltage of the battery,
      dV denotes a change in V over a predetermined period of time,
      dQ denotes a change in Q over the predetermined period of time, and
      dV/dQ denotes a ratio of dV to dQ.

2. The apparatus according to claim 1, wherein the control unit is further configured to:
   determine an estimated Q-dV/dQ curve associated with each adjustment ratio set from the positive electrode Q-dV/dQ curve and the negative electrode Q-dV/dQ curve, based on a first adjustment ratio, a second adjustment ratio, and a third adjustment ratio among the plurality of adjustment ratios included in each adjustment ratio set, wherein a sum of the first adjustment ratio, the second adjustment ratio, and the third adjustment ratio included in each adjustment ratio set is equal to the determined degradation ratio;
   detect a second plurality of feature points associated with each adjustment ratio set from the estimated Q-dV/dQ curve associated with each adjustment ratio set; and
   determine the positive electrode degradation ratio, the negative electrode degradation ratio, and the lithium ion loss ratio, based on the first plurality of feature points and the second plurality of feature points associated with each adjustment ratio set.

3. The apparatus according to claim 2, wherein:
   the control unit is further configured to:
      transform the positive electrode Q-dV/dQ curve into a corrected positive electrode Q-dV/dQ curve associated with each adjustment ratio set, based on the first adjustment ratio included in each adjustment ratio set;
      transform the negative electrode Q-dV/dQ curve into a corrected negative electrode Q-dV/dQ curve associated with each adjustment ratio set, based on the second adjustment ratio and the third adjustment ratio included in each adjustment ratio set; and
      generate the estimated Q-dV/dQ curve associated with each adjustment ratio set, based on the corrected positive electrode Q-dV/dQ curve and the corrected negative electrode Q-dV/dQ curve associated with each adjustment ratio set,
   the corrected positive electrode Q-dV/dQ curve associated with each adjustment ratio set is generated by compressing the positive electrode Q-dV/dQ curve in a first direction along a Q axis as much as the first adjustment ratio included in each adjustment ratio set;
   the first direction is a direction in which the remaining capacity of the Q axis decreases; and
   the corrected negative electrode Q-dV/dQ curve associated with each adjustment ratio set is generated by:

compressing the negative electrode Q-dV/dQ curve in the first direction along the Q axis as much as the second adjustment ratio included in each adjustment ratio set; and shifting the compressed negative electrode Q-dV/dQ curve in a second direction opposite the first direction along the Q axis as much as the third adjustment ratio included in each adjustment ratio set.

4. The apparatus according to claim 2, wherein the control unit is further configured to:

determine a sum of absolute values of differences between the remaining capacity of each of the first plurality of feature points and the remaining capacity of each of the second plurality of feature points associated with each adjustment ratio set, as a similarity index associated with each adjustment ratio set; and determine the first adjustment ratio, the second adjustment ratio, and the third adjustment ratio included in the adjustment ratio set associated with a minimum similarity index among a plurality of similarity indices associated with the plurality of adjustment ratio sets in a one-to-one relationship as the positive electrode degradation ratio, the negative electrode degradation ratio, and the lithium ion loss ratio, respectively.

5. The apparatus according to claim 2, wherein the control unit is further configured to:

determine a sum of squares of differences between the remaining capacity of each of the first plurality of feature points and the remaining capacity of each of the second plurality of feature points associated with each adjustment ratio set, as a similarity index associated with each adjustment ratio set; and determine the first adjustment ratio, the second adjustment ratio, and the third adjustment ratio included in the adjustment ratio set associated with a minimum similarity index among a plurality of similarity indices associated with the plurality of adjustment ratio sets in a one-to-one relationship as the positive electrode degradation ratio, the negative electrode degradation ratio, and the lithium ion loss ratio, respectively.

6. The apparatus according to claim 2, wherein:

at least one of the first plurality of feature points is a maximum point or a minimum point of the measured Q-dV/dQ curve; and at least one of the second plurality of feature points is a maximum point or a minimum point of the estimated Q-dV/dQ curve.

7. The apparatus according to claim 1, wherein the control unit is further configured to regulate the charge or discharge current of the battery below a predetermined current if a difference between two of the positive electrode degradation ratio, the negative electrode degradation ratio, and the lithium ion loss ratio is larger than a threshold.

8. The apparatus according to claim 7, wherein the control unit is further configured to:

select a candidate threshold associated with the determined degradation ratio from a diagnosis table in which a correspondence between the degradation ratio and the candidate threshold is recorded; and determine the selected candidate threshold as the threshold.

9. A battery pack comprising the apparatus according to claim 1.

10. An electric vehicle comprising the battery pack according to claim 9.

11. The battery pack of claim 9, further comprising:

a switch in a current path of the battery for charging and discharging the battery, wherein the control unit is further configured to regulate a charge or discharge current through the switch below a predetermined current if a difference between two of the positive electrode degradation ratio, the negative electrode degradation ratio, and the lithium ion loss ratio is larger than a threshold.

12. A method for determining a degradation state of a battery, comprising:

determining a degradation ratio of the battery and a measured Q-dV/dQ curve, based on sensing information indicating a voltage and a current of the battery, the measured Q-dV/dQ curve indicating a relationship of a remaining capacity of the battery and a ratio of a change in voltage of the battery to a change in remaining capacity of the battery;

generating a plurality of adjustment ratio sets, based on the determined degradation ratio, each adjustment ratio set including a plurality of adjustment ratios;

detecting a first plurality of feature points from the measured Q-dV/dQ curve;

determining a positive electrode degradation ratio, a negative electrode degradation ratio, and a lithium ion loss ratio of the battery, based on the determined degradation ratio, the first plurality of feature points, a predetermined positive electrode Q-dV/dQ curve, a predetermined negative electrode Q-dV/dQ curve, and the plurality of adjustment ratio sets; and regulating a charge or discharge current of the battery based on the positive electrode degradation ratio, the negative electrode degradation ratio, and the lithium ion loss ratio of the battery, where:

Q denotes the remaining capacity of the battery,

V denotes the voltage of the battery, dV denotes a change in V over a predetermined period of time, dQ denotes a change in Q over the predetermined period of time, and dV/dQ denotes a ratio of dV to dQ.

13. The method according to claim 12, wherein the determining the positive electrode degradation ratio, the negative electrode degradation ratio, and the lithium ion loss ratio comprises:

determining an estimated Q-dV/dQ curve associated with each adjustment ratio set from the positive electrode Q-dV/dQ curve and the negative electrode Q-dV/dQ curve, based on a first adjustment ratio, a second adjustment ratio, and a third adjustment ratio among the plurality of adjustment ratios included in each adjustment ratio set, wherein a sum of the first adjustment ratio, the second adjustment ratio, and the third adjustment ratio included in each adjustment ratio set is equal to the determined degradation ratio;

detecting a second plurality of feature points from the estimated Q-dV/dQ curve associated with each adjustment ratio set; and determining the positive electrode degradation ratio, the negative electrode degradation ratio, and the lithium ion loss ratio, based on the first plurality of feature points and the second plurality of feature points associated with each adjustment ratio set.

14. The method according to claim 13, wherein the determining the positive electrode degradation ratio, the negative electrode degradation ratio, and the lithium ion loss ratio further comprises:

determining a sum of absolute values or a sum of squares of differences between the remaining capacity of each of the first plurality of feature points and the remaining capacity of each of the second plurality of feature points associated with each adjustment ratio set as a similarity index associated with each adjustment ratio set;

determining the first adjustment ratio, the second adjustment ratio, and the third adjustment ratio included in the adjustment ratio set associated with a minimum similarity index among a plurality of similarity indices associated with the plurality of adjustment ratio sets in a one-to-one relationship as the positive electrode degradation ratio, the negative electrode degradation ratio, and the lithium ion loss ratio, respectively.

15. The method according to claim 12, wherein the regulating of the charge or discharge current of the battery comprises:

regulating the charge or discharge current of the battery below a predetermined current if a difference between two of the positive electrode degradation ratio, the negative electrode degradation ratio, and the lithium ion loss ratio is larger than a threshold.

16. The method of claim 15, wherein the regulating of the charge or discharge current of the battery further comprises:

selecting a candidate threshold associated with the determined degradation ratio from a diagnosis table in which a correspondence between the degradation ratio and the candidate threshold is recorded; and determining the selected candidate threshold as the threshold.

17. The method of claim 13, wherein the determining of the positive electrode degradation ratio, the negative electrode degradation ratio, and the lithium ion loss ratio further comprises:

determining a sum of squares of differences between the remaining capacity of each of the first plurality of feature points and the remaining capacity of each of the second plurality of feature points associated with each adjustment ratio set, as a similarity index associated with each adjustment ratio set; and determining the first adjustment ratio, the second adjustment ratio, and the third adjustment ratio included in the adjustment ratio set associated with a minimum similarity index among a plurality of similarity indices associated with the plurality of adjustment ratio sets in a one-to-one relationship as the positive electrode degradation ratio, the negative electrode degradation ratio, and the lithium ion loss ratio, respectively.

18. The method of claim 13, wherein:

at least one of the first plurality of feature points is a maximum point or a minimum point of the measured Q-dV/dQ curve; and at least one of the second plurality of feature points is a maximum point or a minimum point of the estimated Q-dV/dQ curve.

* * * * *